(12) United States Patent
Sato

(10) Patent No.: US 7,257,161 B2
(45) Date of Patent: Aug. 14, 2007

(54) FREQUENCY THINNING APPARATUS FOR THINNING OUT FREQUENCY COMPONENTS OF SIGNAL AND FREQUENCY THINNING APPARATUS

(75) Inventor: Yasushi Sato, Nagareyama (JP)

(73) Assignee: Kabushiki Kaisha Kenwood, Tokyo (JP)

( * ) Notice: Subject to any disclaimer, the term of this patent is extended or adjusted under 35 U.S.C. 154(b) by 759 days.

(21) Appl. No.: 10/362,425

(22) PCT Filed: Jun. 27, 2001

(86) PCT No.: PCT/JP01/05522

§ 371 (c)(1),
(2), (4) Date: Feb. 25, 2003

(87) PCT Pub. No.: WO02/17300

PCT Pub. Date: Feb. 28, 2002

(65) Prior Publication Data

US 2003/0202600 A1 Oct. 30, 2003

(30) Foreign Application Priority Data

Aug. 25, 2000 (JP) ............................. 2000-256419

(51) Int. Cl.
*H04B 1/66* (2006.01)
(52) U.S. Cl. ............ 375/240.21; 375/240; 375/240.11; 375/240.25; 375/240.01; 382/232
(58) Field of Classification Search ................ 375/240, 375/240.11, 240.25, 240.01, 240.19; 382/232
See application file for complete search history.

(56) References Cited

U.S. PATENT DOCUMENTS 5,852,630 A * 12/1998 Langberg et al. ............ 375/219

(Continued)

FOREIGN PATENT DOCUMENTS

JP 64-42938 2/1989

(Continued)

OTHER PUBLICATIONS

International Search Report, PCT/JP01/05522, mailed Oct. 9, 2001.

*Primary Examiner*—Mohammed Ghayour
*Assistant Examiner*—Mohsin Benghuzzi
(74) *Attorney, Agent, or Firm*—Eric J. Robinson; Robinson Intellectual Property Law Office, P.C.

(57) ABSTRACT

An analyzer transforms a digital signal into a spectrum representing the digital signal. A spectrum analyzing unit specifies a predetermined number of sets of the bands in decreasing order of the correlation between the spectrum distributions from among the bands obtained by equally dividing the above spectrum into equal bands, and then specifies one of the two specified bands as a removed band and the other as a interpolation band. Then, a frequency shifting unit removes spectrum components within the removed bands and shifts spectrum components within another bands to the lower frequency side (that is, performs the thinning and compressing of frequency), and then supplies a signal representing the spectrum after thinning and compressing to a synthesizer. The synthesizer generates a signal represented by the spectrum after thinning and compressing. Thereby, even a signal having a high-frequency part steeply attenuated can be compressed in its bandwidth in such a manner that it can be exactly restored later, and/or an audio signal information can be compressed keeping high audio quality.

13 Claims, 8 Drawing Sheets

U.S. PATENT DOCUMENTS 6,311,153 B1 * 10/2001 Nakatoh et al. ............ 704/216
6,449,596 B1 * 9/2002 Ejima ........................ 704/501
6,680,972 B1 * 1/2004 Liljeryd et al. ............. 375/240

FOREIGN PATENT DOCUMENTS

| | | |
|---|---|---|
| JP | 2-235424 | 9/1990 |
| JP | 5-297898 | 11/1993 |
| JP | 6-51800 | 2/1994 |
| JP | 2000-36755 | 2/2000 |

* cited by examiner

FREQUENCY THINNING APPARATUS FOR THINNING OUT FREQUENCY COMPONENTS OF SIGNAL AND FREQUENCY THINNING APPARATUS

BACKGROUND OF THE INVENTION

1. Field of the Invention

The present invention relates to an apparatus and method for thinning predetermined frequency components in a signal in order to compress information of the signal to be transmitted or recorded.

2. Related Background Art

In recent years, there is the increasing delivery of information such as music by a cable broadcast, wireless broadcast and communication technique.

Sometimes, lines used in broadcast or communication do not have bandpass characteristics wide enough to transmit audio signals up to its high-frequency part without attenuation. The technique used in such a case is in that the device sending an audio signal boosts the high-frequency part of the audio signal to be sent (that is, amplifies the high-frequency part with a larger amplification factor than the other parts), then sending out the audio signal having the boosted high-frequency part.

The boosting of a high-frequency part has been achieved by passing an audio signal to be sent through an equalizer shown in FIG. 8 and then amplifying it, for example.

The equalizer of FIG. 8 comprises a capacitor C connected between an input and output terminals, a resistor R1 also connected between the input and output terminals and a resistor R2 having one end connected to the output terminal and another end connected to ground. Thus, a signal input to the input terminal is attenuated with larger attenuation factor in the bands except the high-frequency part than in the high-frequency part, and then output from the output terminal.

However, when a signal (for example, a signal having a removed high-frequency part) having a high-frequency part steeply attenuated above a given frequency, such as an audio signal composed of compressed information, is boosted in the high-frequency part and then transmitted, there have been problems in the receiving side that it is difficult to exactly restore the received signal to its original signal (the signal before boosting). If an audio signal is to be transmitted, this problem may result in degrading the quality of the reproduced audio.

The invention has been made by considering the above situation. It is an objective of the present invention to provide an apparatus and method for thinning frequency components of a signal, allowing the compression of the bandwidth of the signal in such a manner that even the signal having a high-frequency part steeply attenuated may be exactly restored.

It is another objective of the invention to provide an apparatus and method for thinning frequency components, allowing the compression of the information of an audio signal while keeping high audio quality.

SUMMARY OF THE INVENTION

In order to attain the above objectives, the frequency thinning apparatus according to the present invention removes specified frequency components of a given time sequence signal to compress the signal information. This apparatus comprises; means for transforming the given time-sequence signal into a frequency spectrum signal; means for removing the frequency component of either one frequency band or another frequency band, if the spectrum pattern of the above described one frequency band has correlation with the spectrum pattern of the above described another frequency band; means for compressing the total length of a continuous spectrum distribution by shifting the residual frequency component to the lower frequency side so as to reduce space in the removed frequency band; means for inversely transforming the signal having the reduced total length of the continuous spectrum distribution into a time sequence signal.

More specifically, the frequency thinning apparatus according to the invention comprises; spectrum distribution generating means for generating the spectrum signal for representing the frequency spectrum of a signal to be directed to the frequency thinning processing; removal band decision means for mutually associating and specifying a sub-band to be removed and a sub-band to be subjected to interpolation from within the whole band including the above described frequency spectrum based on the above described spectrum signal; thinning compression means for substantially removing a spectrum component in a high frequency band by generating the spectrum signal having a continuous spectrum including the spectrum distribution of all the sub-bands within the above whole band except the sub-band to be removed which has been specified by the above described removal band decision means.

Wherein, the above removal band decision means specifies a predetermined number of sets of frequency sections within the above band in decreasing order of the correlation between the distributions of spectrum components, and then specifies two frequency-sections making up each of the specified sets as the above described sub-band to be removed and the above described sub-band to be subjected to interpolation which have been mutually associated.

Further, according to the frequency thinning apparatus for thinning frequency components, one of a set of the bands having strong correlation becomes a sub-band to be removed (removal band). Then, a spectrum within the removal band is removed and the spectrum within another band is shifted to the lower frequency side, so that the bandwidth of the signal is compressed.

Even if a signal to be compressed by such a frequency thinning apparatus have a high frequency part steeply attenuated, by substantially conforming the spectrum distribution of the removal band to the spectrum distribution of a sub-band to be subjected to interpolation (interpolation band), the signal compressed can be exactly restored. Therefore, when the information of an audio signal is to be compressed, the audio signal can be compressed keeping high audio quality.

If the above described frequency thinning apparatus further has means for outputting information representing the above described removal band and the above described interpolation band which have been specified by the above described removal band decision means, an external device for restoring the compressed signal may easily specify the removal band and the interpolation band.

Further, if the above described removal band decision means specifies the above described removal band and the above described interpolation band such that the above described interpolation band may not also serve as the above described removal band, a spectrum within the interpolation band may be prevented from being removed, thereby allowing the more exact restoring of compressed signal.

Further, the above described removal band decision means may specify the above described removal band and the above described interpolation band such that the band adjacent to the above described removal band and occupying the substantially same bandwidth as the above removal band may be the interpolation band related to the above removal band.

In this case, the spectrum of the removal band can be interpolated, for example, based on the frequency components included within a band which is adjacent to the removal band and occupies the substantially same bandwidth as the removal band, thereby allowing the interpolation of the spectrum within the removal band without requirement of additional information for specifying the interpolation band.

Wherein, a typical signal directed to the above frequency thinning processing is a digital signal obtained by sampling and quantizing an analog audio signal, for example, a PCM digital signal.

DETAILED DESCRIPTION OF THE PREFERRED EMBODIMENTS

Hereinafter, embodiments of the frequency thinning apparatus according to the present invention will be described in detail with reference to the drawings.

Figure 1:
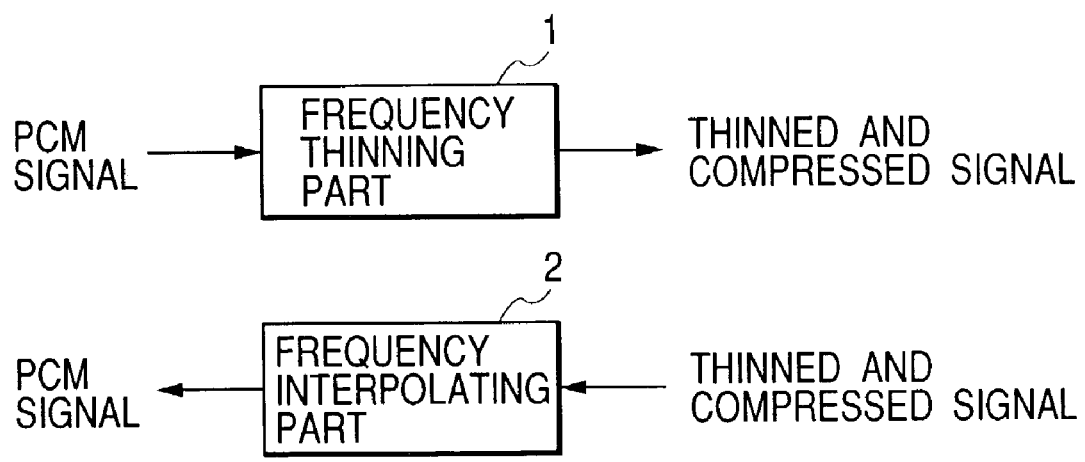
FIG. 1 shows a configuration of an audio signal processing apparatus according to an embodiment of the invention.

FIG. 1 shows the configuration of an audio signal processing apparatus as a frequency thinning apparatus according to an embodiment of the invention.

As shown in FIG. 1, the audio signal processing apparatus comprises a frequency thinning part 1 and a frequency interpolating part 2.

Figure 2:
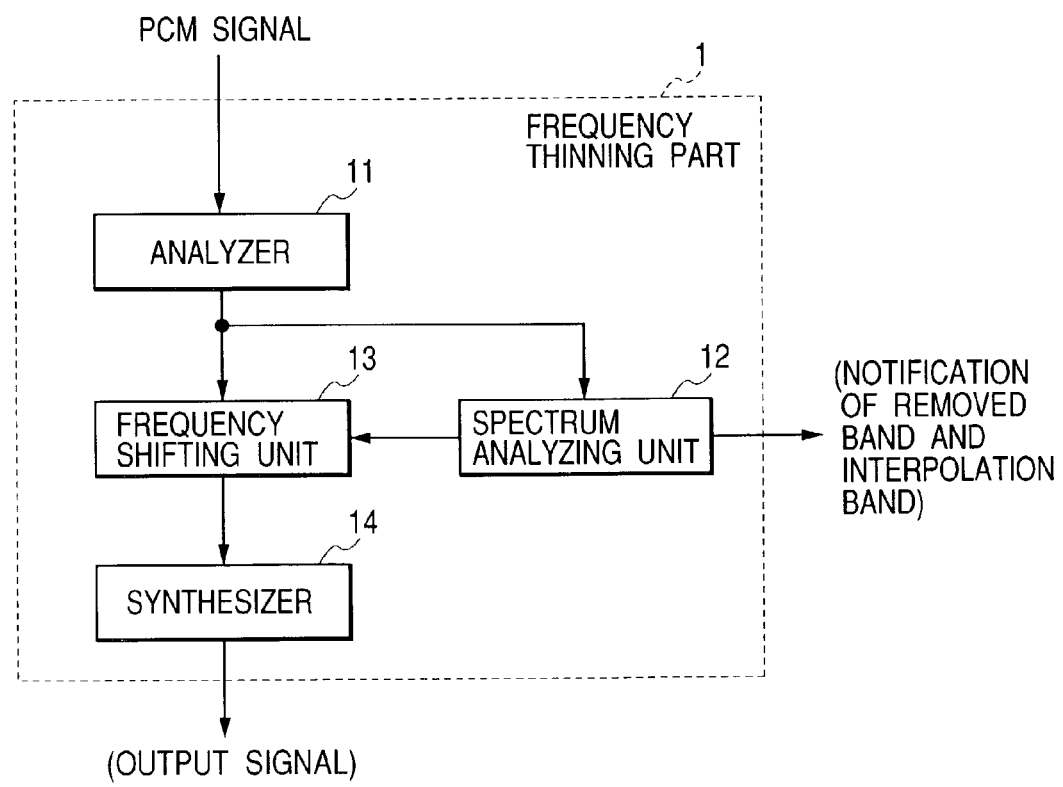
FIG. 2 shows a configuration of the frequency thinning part of FIG. 1.

The frequency thinning part 1 comprises an analyzer 11, a spectrum analyzing unit 12, a frequency shifting unit 13, and a synthesizer 14, as shown in FIG. 2.

Figure 3:
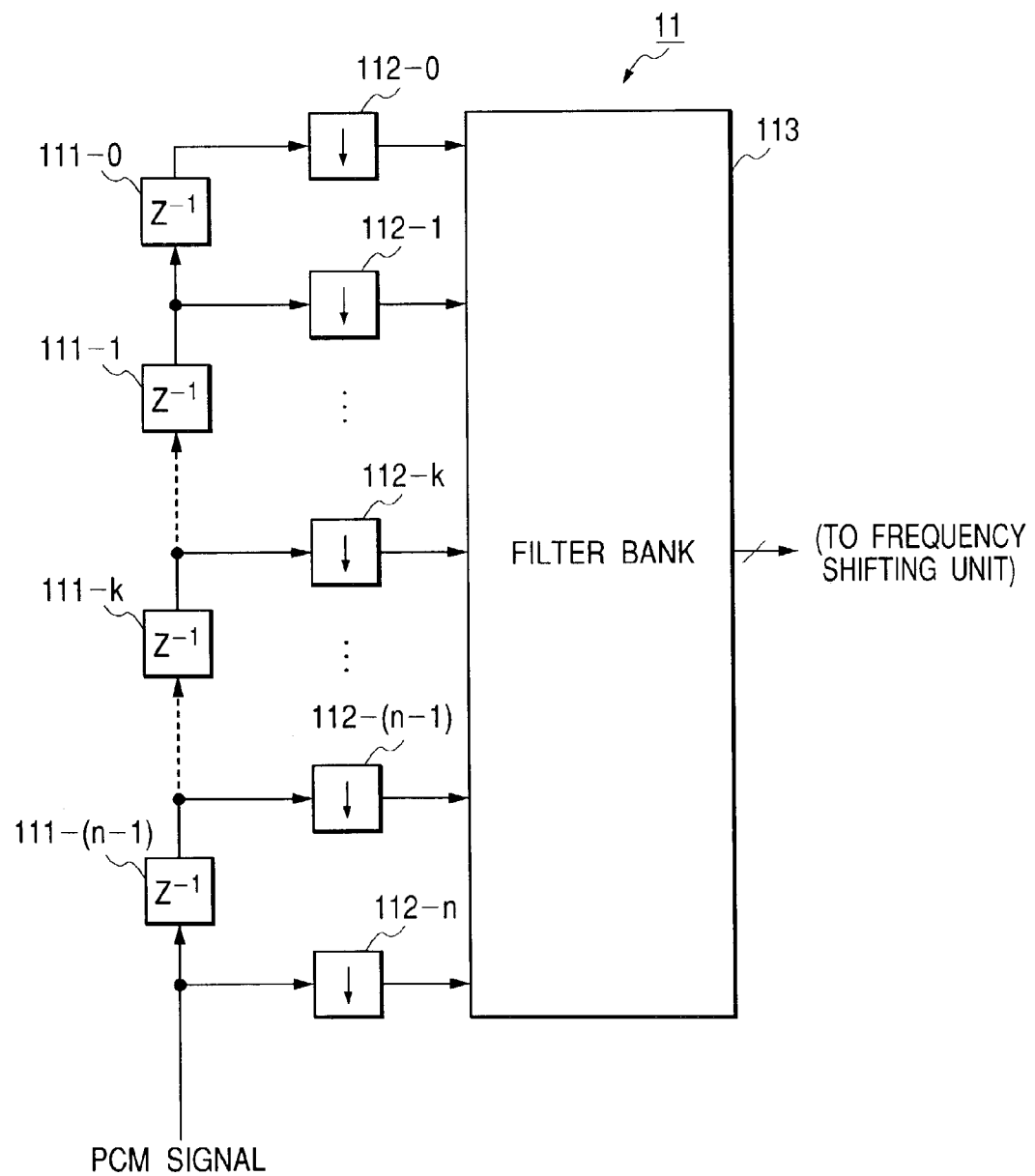
FIG. 3 shows a configuration of the analyzer of FIG. 2.

The analyzer 11, as shown in FIG. 3, comprises n delay units 111-0 to 111-(n−1), (n+1) samplers 112-0 to 112-n, a filter bank 113 (where n is any integer equal to or more than 1).

The delay units 111-0 to 111-(n−1) make up a shift register, by which a signal supplied to each unit is delayed for one cycle period of the sampling period of the signal before being output therefrom.

The signal output from the delay unit 111-k is supplied to the sampler 112-k (where k is any integer equal to or more than 0 and equal to or less than (n−1)). The signal output from the delay unit 111-(j+1) is also supplied to the delay unit 111-j (where j is any integer equal to or more than 0 and equal to or less than (n−2)). A signal to be directed to signal processing (that is, a signal to undergo the frequency thinning processing by the frequency thinning part 1) is supplied to the delay unit 111-(n−1).

This supplied signal may be a digital signal (for example, a PCM digital signal) obtained by sampling an analog signal with a predetermined sampling frequency and then quantizing the obtained samples.

Therefore, the delay unit 111-k delays a PCM signal supplied to the delay unit 111-(n−1) for the (n−k) sampling periods of the PCM signal and then output the delayed signal. Here, the above PCM signal is obtained by PCM modulation of an audio signal representing audio and others as a change in voltage or current.

The samplers 112-0 to 112-n each sample a signal supplied to each sampler at the frequency equal to 1/(n+1) of the frequency of a PCM signal, which is to undergo the frequency thinning processing. Then each sampler supplies the signal representing the sampling results to the filter bank 113.

The sampler 112-k receives the signal output from the delay unit 111-k, as described above. The PCM signal to undergo frequency interpolation processing is supplied to the sampler 112-n and the delay unit 111-(n−1) at the substantially same time, from the frequency thinning part 1.

The filter bank 113 comprises a DSP (Digital Signal Processor), a CPU (Central Processing Unit) and others.

The filter bank 113 receives the signals output from the samplers 112-1 to 112-n, as described above.

The filter bank 113 generates the (n+1) signals from first to (n+1)th representing spectrum distribution of the signals which are supplied to the bank 113 from the samplers 112-1 to 112-n. At this time, a technique such as a polyphase filter, DCT (Discrete Cosine Transform), LOT (Lapped Orthogonal Transform), QMF (Quadrature Mirrors Filter), MLT (Modulated Lapped. Transform), or ELT (Extended Lapped Transform) may be used. Then, the generated (n+1) signals are supplied to the spectrum analyzing unit 12 and the frequency-shifting unit 13.

Assume that the pth signal generated by the filter bank 113 is a signal to represent the spectrum distribution of the lowest frequency band but (p−1) bands among the (n+1) bands each having the equal bandwidth, wherein the above (n+1) bands are obtained by equally dividing the spectrum distribution output from the samplers 112-0 to 112-n into the (n+1) equal bands (where p is an integer between 1 and (n+1)).

The spectrum analyzing unit 12 comprises a DSP, a CPU and others. The spectrum analyzing unit 12 receives the (n+1) signals each representing spectrum distribution within each of the above (n+1) bands, from the analyzer 11 (more specifically, from the filter bank 113). At this time, the spectrum analyzing unit 12 performs the processes (1) to (5) described below.

(1) The spectrum analyzing unit 12 first specifies two bands from among the respective bands represented by the signals supplied from the filter bank 113, and then determines the square mean value of the spectrum components within each of the bands.

(2) Using the square mean values of the spectrum components within the two bands determined in the process (1) (hereinafter, each called "first band" and "second band"), each value of the spectrum components within one of these two bands are scaled. More specifically, for example, the ratio of the square mean value of the spectrum components within the second band to the square mean value of the spectrum components within the first band is determined. Then, the respective values of the spectrum components within the second band are multiplied by the above ratio. The aggregation of the above obtained products is the scaled spectrum-distribution within the second band.

(3) A correlation factor between the scaled spectrum-distributions within the first and second bands is determined with the method of the least squares or other techniques.

Wherein, assuming that each frequency of the spectrum components within the band having lower frequency of the first and second bands is the sum of its original frequency value plus a difference frequency between the minimum frequencies of the both bands, the spectrum analyzing unit 12 determine the correlation factor.

(4) The spectrum analyzing unit 12 determines the correlation factor by performing the above processes from (1) to (3) for all the possible combinations as the combination of the first and second bands. Then, the bands to be directed to the spectrum removal processing, i.e. removed bands, are determined from among the respective bands representing the signals supplied from the filter bank 113, based on each of the determined correlation factors.

More specifically, the spectrum analyzing unit 12 specifies a predetermined number of the combinations in decreasing order of the correlation factors from the largest one, among the respective combinations for which it has determined correlation factors. (Hereinafter, this predetermined number is assumed to be X. Here, X is an integer equal to or less than (n+1). The product value of (n+1−X) and the bandwidth of any one of the respective bands represented by the signals supplied from the filter bank 113 becomes the bandwidth of the output signal output from the frequency thinning part 1, as described later.) Then, one band is specified from each of the above specified combinations without duplication, that is, a total of X bands are specified. Thus, each of the X specified bands is determined as a removed band.

(5) Then, the spectrum analyzing part 12 notifies the frequency shifting part 13 of the removed bands and the interpolation bands for subjecting the removed bands to interpolation by a process later described. Specifically, the spectrum analyzing unit 12 supplies a total of X sets of data provided by the following (5A) and (5B) as the data (band assigning information) for indicating the removed bands and interpolation bands, to the frequency shifting part 13. Also, the spectrum analyzing unit 12 outputs the data to the outside in synchronization with PCM signals generated by the synthesizer 14 as described later. Wherein, the above (5A) and (5B) is provided as follows;

(5A) data for indicating a removed band, and (5B) data for identifying, as a interpolation band, a band combined, in the manner specified by the above (4), with the removed band indicated by the data of (5A).

The frequency shifting unit 13 comprises a DSP, a CPU and others. When the frequency shifting unit 13 receives the above (n+1) signals from the filter bank 113 and the notification of the removed bands and interpolation bands from the spectrum analyzing unit 12, it performs the following processes (6) and (7).

(6) First, the frequency shifting unit 13 removes the spectra within the removed bands among the spectra represented by the above (n+1) signals supplied from the filter bank 113 (that is, the spectrum distribution is thinned out).

(7) Then, the frequency shifting unit 13 compresses the thinned spectrum-distribution obtained by thinning out the spectrum distribution.

More specifically, the spectrum distributions within the bands other than the removed bands are shifted to the lower frequency side. That is, the frequency shifting unit 13 generates a signal resulting from the following processes (7A) and (7B). (However, the signal is not necessarily obtained by the processes (7A) and (7B). Any process providing the substantially same signal as the signal obtained by the processes (7A) and (7B) can be used.)

(7A) It is definitively assumed that, among the bands (unremoved bands) which are other than the removed bands and of which minimum frequencies are in higher frequency side than the removed-bands having the lowest minimum frequency, the spectrum distribution of the unremoved band having the lowest minimum frequency is handled as the spectrum distribution of the removed band having the lowest minimum frequency (that is, the spectrum distribution of the unremoved band is shifted into the removed band). Here, when the spectrum distribution of the unremoved band is shifted into the removed band, it is assumed that the value of frequency sift is obtained by subtracting, from the value of original frequency, the absolute value of a difference frequency between the minimum frequency of the unremoved band having the spectrum shifted and the minimum frequency of the removed band receiving the shifted spectrum.

(7B) Then, the removed band that has received the shifted spectrum is regarded as a new unremoved band and the unremoved band that has sent out the shifted spectrum to the removed band is regarded as a new removed band. Thus, the process (7A) is repeated until there is no unremoved band remained in the higher frequency side than a removed band.

The frequency shifting unit 13 generates a signal for representing the spectrum distribution created by the completion of the above processes up to (7B) and supplies the generated signal to the synthesizer 14.

Therefore, a signal representing the spectrum distribution obtained by packing the spectrum distribution within each of the bands other than the removed bands to the lower frequency side (that is, the spectrum distribution obtained by thinning and compressing) is supplied from the frequency shifting unit 13 to the synthesizer 14.

Figure 4:
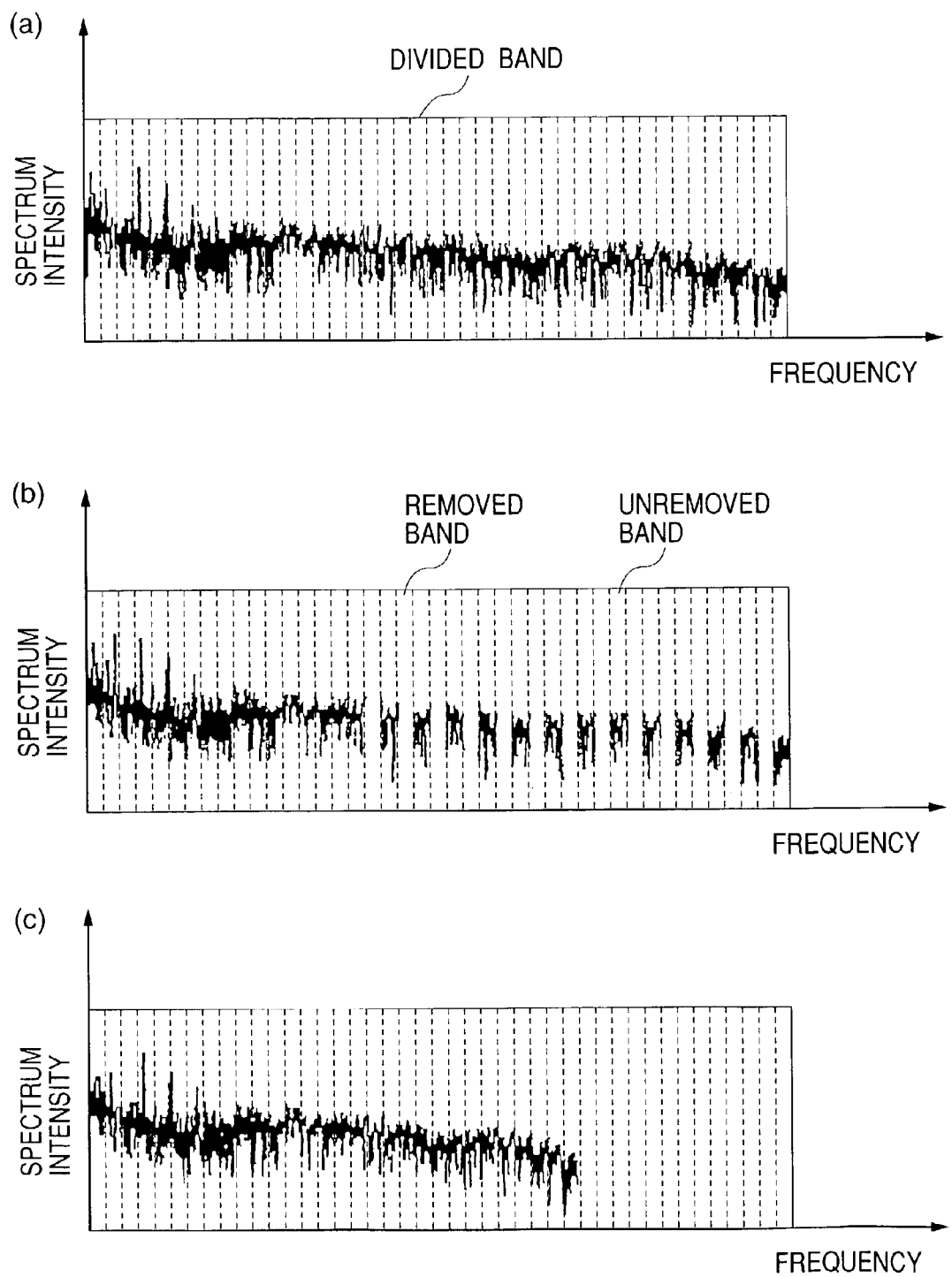
FIG. 4A shows an example of a spectrum distribution before frequency thinning.
FIG. 4B shows an example of a spectrum distribution after frequency thinning of the spectrum distribution shown in FIG. 4A.
FIG. 4C shows an example of a spectrum distribution after frequency thinning and compressing of the spectrum distribution shown in FIG. 4A.

FIG. 4A shows an example of the spectrum distribution (before thinning) of a PCM signal supplied to the analyzer 11. FIG. 4B shows the thinned spectrum distribution obtained by subjecting the spectrum distribution of FIG. 4A to the frequency thinning processing. FIG. 4C shows the thinned and then compressed spectrum distribution obtained by subjecting the PCM signal with the spectrum distribution of FIG. 4B to compression processing.

FIG. 4B shows the spectrum distribution after thinning, in which the band having the lowest minimum frequency but (2·Y−1) is specified as the removed band among 60 bands of a PCM signal supplied to the analyzer 11 (where Y is any integer equal to or more than 11 and equal to or less than 30).

FIG. 4C shows a spectrum distribution after thinning and compression, which is obtained by subjecting the spectrum having the spectrum distribution of FIG. 4B to the compression of spectrum distribution. In the spectrum distribution shown in FIG. 4C, the spectrum of the {(2·Z)−21}th band is shifted to the Zth band (where, Z is any integer equal to or more than 22 and equal to or less than 40).

Figure 5:
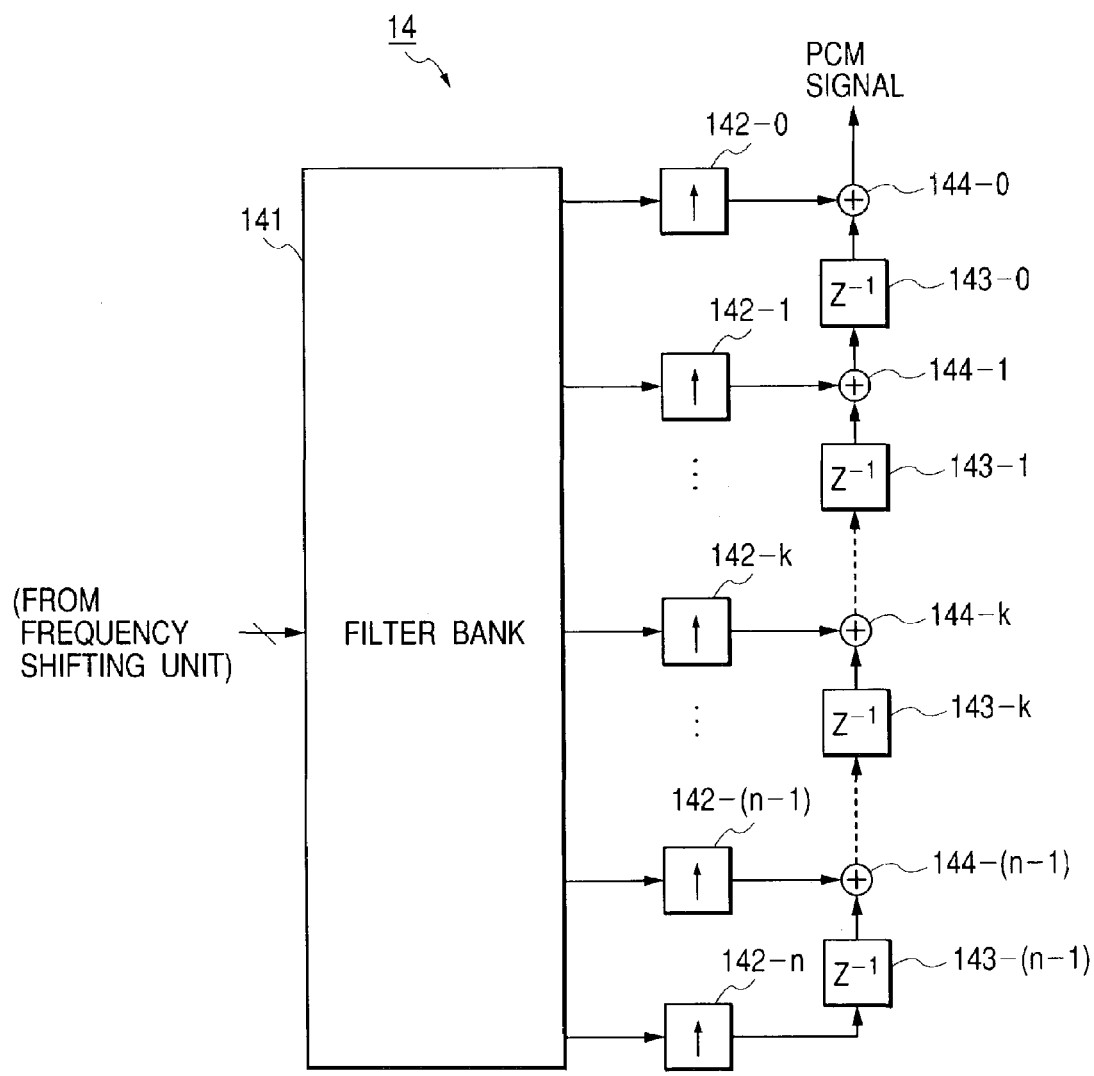
FIG. 5 shows a configuration of the synthesizer of FIG. 2.

The synthesizer 14 comprises a filter bank 141, (n+1) samplers 142-0 to 142-n, n delay units 143-0 to 143-(n−1), and adders 144-0 to 144-(n−1), as shown in FIG. 5.

The filter bank 141 comprises a DSP, a CPU and others, and receives a signal representing spectrum distribution after thinning and compression, which is output from the frequency shifting unit 13.

Further, the filter bank 141 samples the signal having the spectrum distribution represented by a signal supplied to it, at (n+1) points evenly spaced, and then generates the (n+1) signals representing the above sampled values. In this sampling, a technique such as a polyphase filter, DCT, LOT, MLT or ELT may be used. Then, the pth signal of the (n+1) signals above generated is supplied to the sampler 142-(p−1) (where, p is an integer from 1 to (n+1)).

Here, the sampling interval for the values represented by the signals generated by the filter bank 141 is assumed to be substantially equal to the sampling interval of the samplers 112-1 to 112-n in the analyzer 11.

Further, it is assumed that the pth signal generated by the filter bank 141 represents the value sampled at the pth earliest time, among the values obtained by sampling the signal having the spectrum distribution represented by the signal supplied to the filter bank 141, at (n+1) points evenly spaced.

The samplers 142-1 to 142-n each transform the signals supplied to each sampler to the signals of (n+1)-times higher frequency than the supplied signals and then outputs the PCM signals representing the transformed results.

The sampler 142-(p−1) receives the pth signal output from the filter bank 141 as described above. The sampler 142-(s−1) supplies its output signal to the adder 144-(p−1) (s is an integer from 1 to n). The sampler 142-n supplies its output signal to the delay unit 143-(n−1).

The delay units 143-0 to 143-(n−1) each delay the signal supplied to each unit for one cycle period of the period of the signal, and output the delayed signals.

The output signal from the delay unit 143-k is supplied to the adder 144-k (where k is any integer equal to or more than 0 and equal to or less than (n−1)). Further, the delay unit 143-j receives the signal output from the adder 144-(j+1) (where j is any integer equal to or more than 0 and equal to or less than (n−2)). The delay unit 143-(n−1) receives the signal output from the sampler 142-n as described above.

The adders 144-0 to 144-(n−1) each output the signals representing the sum of two signals supplied to each adder.

The adder 144-k receives the signals supplied from the sampler 142-k and the delay unit 143-k. The output signal from the adder 144-m is supplied to the delay unit 143(m−1) (where m is an integer equal to or more than 1 and equal to or more than (n−1)). The output signal, from the adder 144-0 makes up an output signal from the frequency thinning part 1.

The output signal from the adder 144-0 corresponds to a series of the output signals from the samplers 142-0, 142-1, 142-(n−1) and 142-n, which is sequentially output with the period substantially equal to the period of the PCM signal supplied to the analyzer 11, respectively. Further, the output signal from the adder 144-0 is a PCM signal corresponding to the spectrum distribution after thinning and compression.

The bandwidth of the output signal is substantially equal to (n+1−X) multiplied by the bandwidths of any one of the respective bands represented by the signals supplied to the frequency shifting unit 13 from the filter bank 113. For this reason, the bandwidth of the output signal is reduced to $\{(n+1-X)/(n-1)\}$ of the bandwidth of the PCM signal supplied to the analyzer 11.

Figure 6:
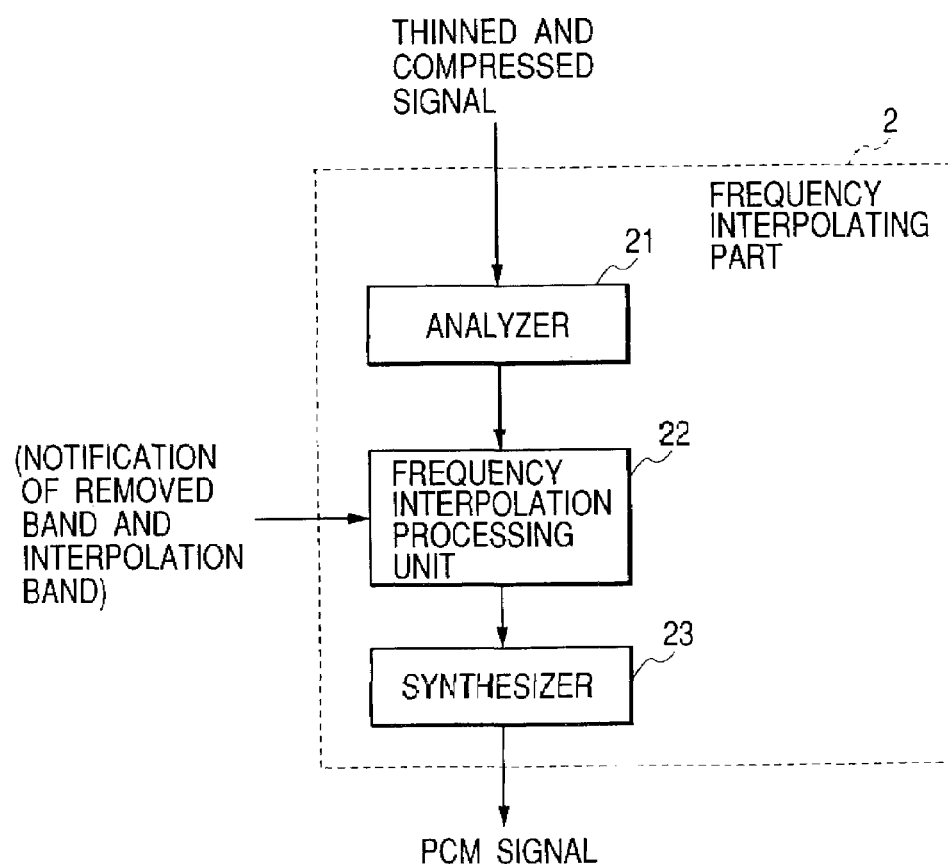
FIG. 6 shows a configuration of the frequency interpolating part of FIG. 1.

The frequency interpolating part 2 comprises an analyzer 21, a frequency interpolation processing unit 22, and a synthesizer 23, as shown in FIG. 6.

The analyzer 21 has the substantially same configuration as the analyzer 11 in the frequency thinning part 1. The synthesizer 23 has the substantially same configuration as the synthesizer 14 in the frequency thinning part 1.

The analyzer 21 generates the (n+1) signals from first to (n+1)th for representing the spectrum distribution of a PCM signal, wherein the PCM signal is supplied as a signal to be directed to frequency interpolation processing from the outside. The (n+1) signals generated are supplied to the frequency interpolation processing unit 22.

Therein, it is assumed that the pth signal generated by the analyzer 21 represents the spectrum distribution of the band having the lowest frequency but (p−1) (where p is an integer from 1 to (n+1)) among the (n+1) bands having the equal bandwidth, wherein the (n+1) band are obtained by equally dividing the spectrum distribution of a PCM signal (that is, the PCM signal to be directed to the frequency interpolation processing) supplied from the data expansion unit into (n+1) equal bands.

The frequency interpolation processing unit 22 comprises a DSP, a CPU, and others. The frequency interpolation processing unit 22 receives the (n+1) signals each representing the spectrum distribution within each of the above (n+1) bands from the analyzer 21. When notified of the removed bands and interpolation bands, the frequency interpolation processing unit 22 performs the processes (8A) and (8B) as described below, thereby expanding the spectrum after thinning and compression to form the spectrum after expansion.

(8A) Among the bands represented by the signals supplied from the analyzer 21, each spectrum within the removed band having the lowest minimum frequency and within the respective bands in the higher frequency side than the above removed band is shifted toward higher frequency side by the amount corresponding to one band, respectively. That is, it is assumed that the spectrum distribution within each of the above bands represents the spectrum distribution within each adjacent band on the higher frequency side, respectively. Wherein, it is assumed that each frequency of the spectrum within the above bands is handled as the sum of its original value of frequency plus the bandwidth of the above bands. As a result, the spectrum within the removed band having the lowest minimum frequency has been removed.

(8B) The removed band of which spectrum has been removed by the process (8A) is regarded as a new unremoved band. Then, the process (8A) is repeated until there is remained no removed band.

Next, the frequency interpolation processing unit 22 specifies a function representing an envelope for the spectrum distribution after expansion processing obtained by processes up to (8B). Then, regression calculations based on the specified function determines the estimated square-mean value of the spectrum components which should be inherently involved in the removed bands of which spectra have been removed.

Then, the frequency interpolation processing unit 22 performs the scaling of the above interpolation band notified from the outside, and determines the spectrum distribution to be interpolated into the removed band pairing up with the interpolation band.

That is, the frequency interpolation processing unit 22 first determines the square-mean value of the spectrum components within the interpolation band. Then, the ratio of the estimated value of the square-mean value of the spectrum components within the removed band to the square-mean value of the spectrum components within the interpolation band is determined. Then, the obtained ratio is multiplied to each value of the spectrum components within the interpolation band, respectively. Thus, the aggregation of the obtained products represents the spectrum distribution that should be interpolated into the removed band pairing up with this interpolation band.

Therefore, the signal supplied from the frequency interpolation processing unit 22 to the synthesizer 23 represents the distribution of the spectrum (spectrum distribution after interpolation) obtained by adding the spectrum components of the removed bands after interpolation to the spectrum of the PCM signal supplied to the frequency interpolating part 2 from the outside.

However, when the frequency interpolation processing unit 22 handles the spectrum distribution to be interpolated into the removed band as the spectrum distribution in the removed band after interpolation, it is assumed that each frequency of the spectrum within the scaled interpolation band is handled as the sum of its original value of frequency plus the absolute value of the difference frequency between the minimum frequencies of the removed band and the interpolation band.

The synthesizer 23 receives the signal representing the spectrum distribution after interpolation from the frequency interpolation processing unit 22, and then it outputs a PCM signal having the spectrum distribution corresponding to the spectrum distribution after interpolation. In other words, the output signal from the synthesizer 23 corresponds to a PCM signal for sequential output of the signals obtained by sampling the signal having the spectrum distribution after interpolation at (n+1) points evenly spaced, wherein the signal is output with the period substantially equal to the period of the PCM signal supplied to the analyzer 21.

Figure 7:
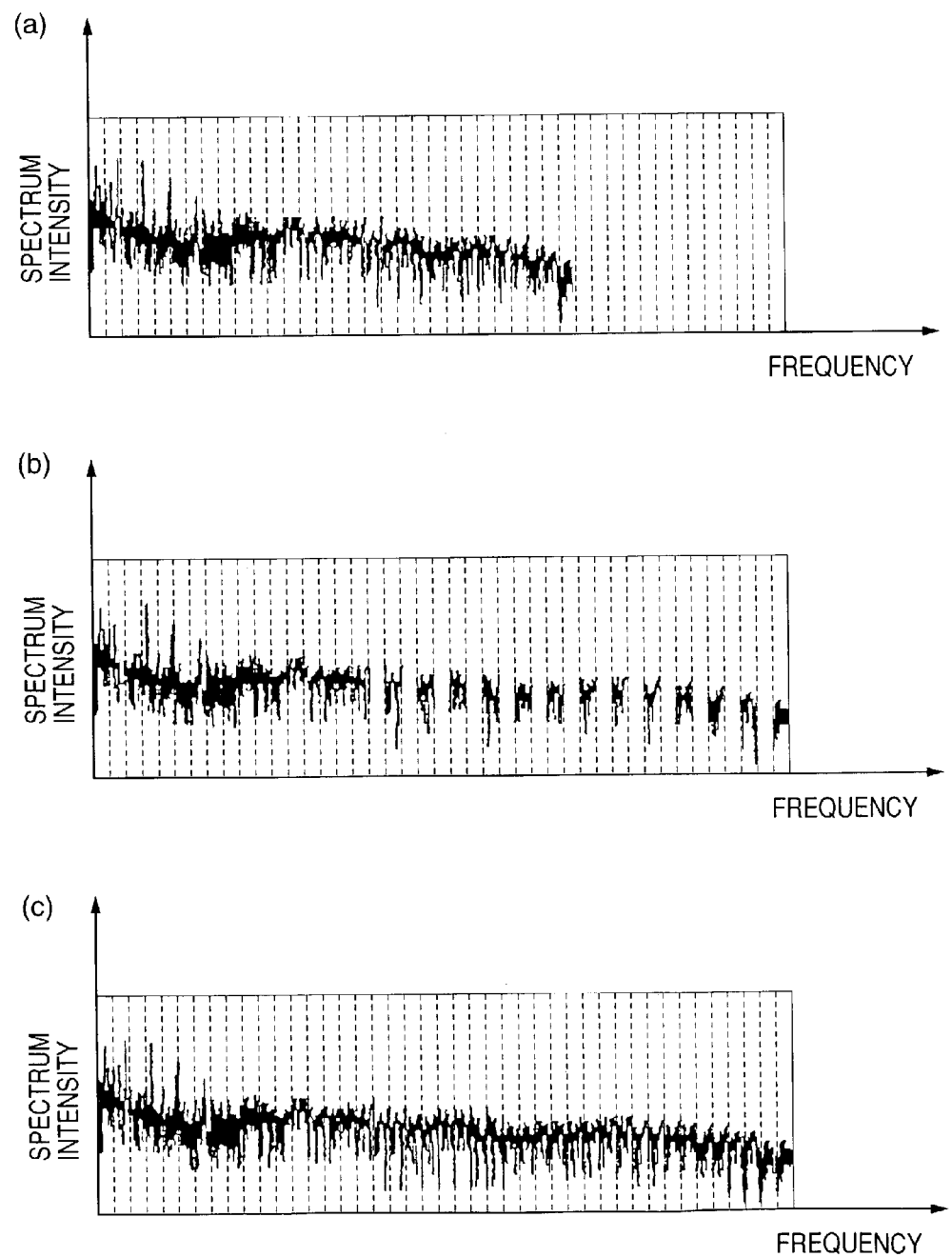
FIG. 7A shows an example of a spectrum distribution before expansion and interpolation.
FIG. 7B shows an example of a spectrum distribution after expansion.
FIG. 7C shows an example of a spectrum distribution after interpolation.
Figure 8:
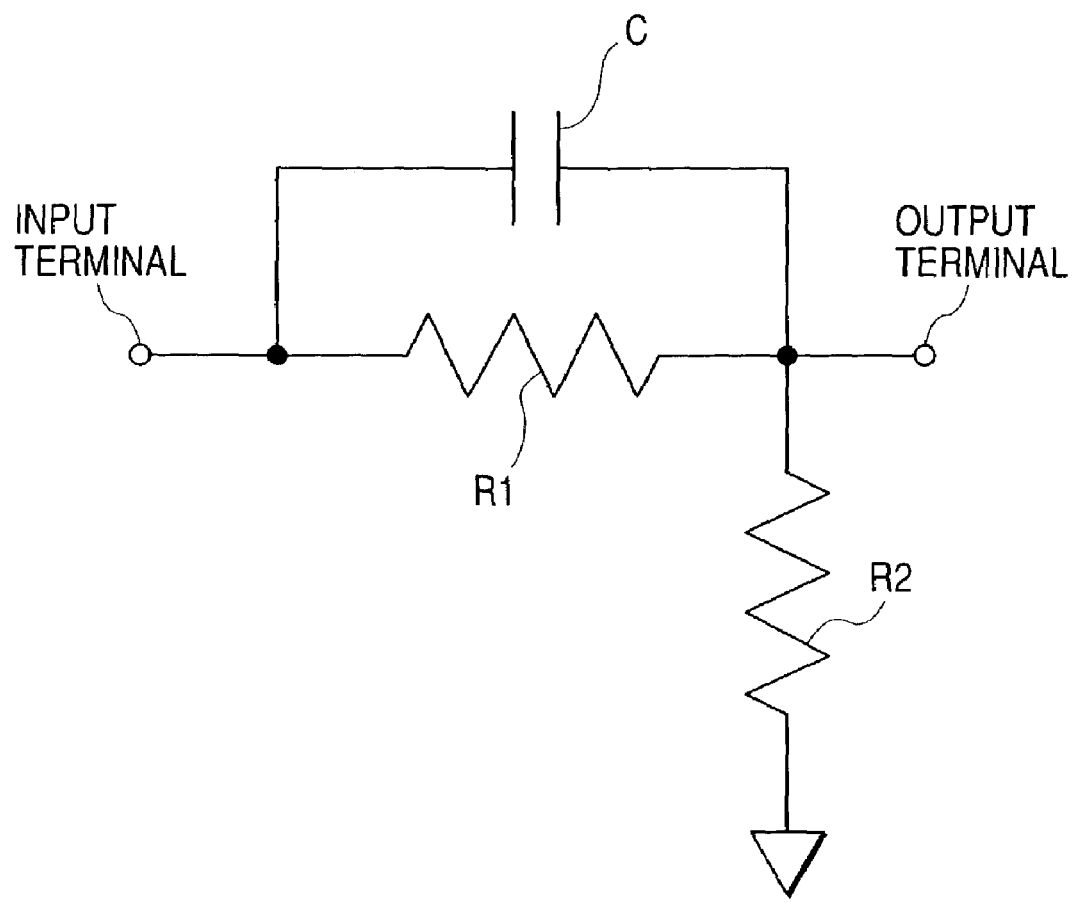
FIG. 8 shows a circuit diagram illustrating a configuration of an equalizer.

Here, FIG. 7A shows an example spectrum distribution (before expansion and interpolation) of a PCM signal supplied to the analyzer 21. FIG. 7B shows the spectrum distribution obtained by expanding the spectrum distribution of FIG. 7A, that is, the spectrum distribution after expansion. FIG. 7C shows an example spectrum distribution after interpolation, obtained by subjecting the expanded spectrum of FIG. 7B to frequency interpolation processing.

Wherein, it is assumed that the PCM signal having the spectrum distribution of FIG. 7A is a signal obtained by subjecting an original audio signal, that is, neither thinned nor compressed, to the substantially same processing as the frequency thinning part 1 of the audio signal processing apparatus according to the invention. Among 60 bands dividing equally the spectrum of the original audio signal into equal bands, a removed band is the band having the lowest minimum frequency but (2·Y)−1 and the interpolation band pairing up with the removed band has the lowest minimum frequency but {(2·Y)−2} (where Y is any integer equal to or more than 11 and equal to or less than 30).

In this case, as shown in FIG. 7B, the spectrum after expansion corresponds to the spectrum obtained by shifting the spectrum of the lowest frequency band but Z−1 to the (2·Z−21)th band, in the spectrum of FIG. 7A (wherein Z is an integer equal to or more than 22 and equal to or less than 40).

Further, the spectrum distribution after interpolation is equal to the sum of the removed band (the lowest frequency band but 2·Y−1) plus the spectrum having the substantially same distribution as the spectrum distribution of the interpolation band(the lowest frequency band but {(2·Y)−2}) pairing up with the above removed band, as shown in FIG. 7C.

Expansion such as shown in FIG. 7B and interpolation such as shown in FIG. 7C provides a spectrum close to the spectrum of a PCM signal before undergoing frequency thinning and compression. Therefore, the restoring of audio signals by means of PCM signals output from the synthesizer 23 provides audio signals with high audio quality.

The configuration of the audio signal processing apparatus is not limited to the configuration described above.

For example, the frequency thinning part 1 may further comprise a data-compressing unit. It is assumed that the data-compressing unit comprises a DSP, a CPU and others, and further comprises a storage-medium driver for writing data to and reading data from a storage medium (for example, CD-R, etc.). It is assumed that the data-compressing unit receives output signals from the frequency thinning part 1 and compresses the data represented by the output signals using a technique such as MP3, AAC (Advanced Audio Coding), outputting the compressed data. Alternatively, the data obtained by the above compression are recorded into an external storage medium, which is set on the storage-medium driver.

The data-compressing unit may comprise a communication control apparatus composed of a modem connected to an external communication line, terminal adapter and others, in stead of the storage-medium driver or together with the storage-medium driver. In this case, the data-compressing unit may compress the data represented by output signals from the frequency thinning part 1 and transmit the resultant data through communication lines to the outside.

Further, the audio signal processing apparatus may comprise a data-expanding unit. It is assumed that the data-expanding unit comprises a DSP, a CPU, and others, and further comprises a storage-medium driver. The data-expanding unit receives the signal of the data obtained by compressing a PCM signals with a technique such as MP3 and AAC through an external storage medium set on a storage medium driver or using any other technique from the outside. Then, it is assumed that the data-expanding unit expands the obtained data by a technique such as MP3 and AAC, and generates the PCM signals representing the data obtained by the above expansion, then supplying the generated PCM signals to the frequency interpolating part 2.

The data-expanding unit may comprise a communication control apparatus, in stead of a storage-medium driver or together with a storage-medium driver. In this case, the signal representing the data obtained by compressing a PCM signal by a compression technique such as MP3 and AAC is supplied to the data-expanding unit through a communication line from the outside. Then, the data-expanding unit may receive and expand the supplied data, and then supply a PCM signal representing the data obtained by expansion to the frequency interpolating part 2.

Also, a signal to be directed to the frequency thinning in the frequency thinning part 1 and a signal to be directed to the frequency interpolating in the frequency interpolating part 2 is nether limited to a PCM signal nor a modulated wave obtained by modulating an audio signal.

Further, a DSP and CPU may perform the functions of the delay units 111-0 to 111-($n$−1) and 143-0 to 143-($n$−1), and samplers 112-0 to 112-$n$ and 142-0 to 142-$n$, and adders 144-0 to 144-($n$−1).

Further, instead of a correlation factor, the spectrum analyzer unit 12 may determine any numerical value representing the correlation between the spectra of two bands based on the spectrum distributions of both bands, and then use the numerical value to determine the removed band (and the interpolation band).

Further, as the content of the above process (4), the spectrum analyzer unit 12 may perform the above described processes (1)-(3) only for the combinations of the bands adjacent to each other, in stead of performing the above described processes (1)-(3) for all the possible combinations as the combination of the first and second bands. Then, the spectrum analyzer unit 12 may specify a predetermined number of the combinations in decreasing order of the correlation factors from the largest one, among the respective combinations for which it has determined a correlation factor. Then, the band of the higher frequency side (or lower frequency side) of each specified combination may be determined as a removed band, and the band of the lower frequency side (or higher frequency side) may be determined as a interpolation band.

Further, if a interpolation band (or a removed band) for a PCM signal supplied to the frequency interpolating part 2 is adjacent to the interpolation band (or the removed band) on the lower frequency side (or higher frequency side), the frequency interpolating part 2 does not require to receive the notification of the interpolation band (or removed band) in order to expand or interpolate the PCM signal.

Further, in the above processing, the frequency thinning part 1 shifts each spectrum within unremoved bands to the lower frequency side keeping the high-low relation of frequency between the respective spectra. However, the high-low relation of frequency between the respective spectra is not necessarily kept after compression. Each spectrum within an unremoved band may be shifted keeping such a relation that the spectrum distribution of any part within the unremoved bands may substantially conform with at least a part of the spectrum distribution after compression.

Although the embodiments of the invention have been described hereinbefore, the frequency thinning apparatus according to the invention can be implemented using a general computer system, not a specialized system. For example, from a medium (CD-ROM, MO, a floppy disk, etc.) storing a program for executing the operations of the analyzer 11, spectrum analyzing unit 12, frequency shifting unit 12, and synthesizer 14 as above described, that program may be installed into a personal computer or microcomputer, thereby constructing the frequency thinning part 1 performing the processes as above described.

Further, from a medium storing a program for executing the operations of the analyzer 21, frequency interpolation processing unit 22 and synthesizer 23 as above described, that program may be installed a personal computer or microcomputer, thereby constructing the frequency interpolating part 2 performing the processes as above described.

Further, for example, the program may be posted on the bulletin board system (BBS) in a communication line and then delivered through the communication line. A modulated wave obtained by modulating a carrier with a signal for representing the program may be transmitted, so that a receiving device receiving the modulated wave demodulates it for restoring the program.

Further, the program starts to run under the control of an OS, and thus the program may be executed in the same manner as other application programs, performing the processing as described above.

By the way, if an OS shares part of the processing or an OS constitutes part of one component of the invention, the storage medium may store the remaining program except that part. In this case, in the invention, the storage medium may store each function executed by the computer or a program for performing steps.

As described above, according to the invention, a frequency thinning apparatus and frequency thinning method are provided for compressing the bandwidth of a signal in such a manner that even the signal having frequency components steeply attenuated in high frequency part can be exactly restored. Further, according to the invention, a frequency thinning apparatus and frequency thinning method are provided for compressing an audio signal while maintaining the high quality of the audio signal.

What is claimed is:

1. A frequency thinning apparatus for performing compression of signal information by removing specified frequency components in a given time sequence signal, said apparatus comprising:

means for transforming the given time sequence signal into a frequency spectrum signal;

removal band decision means for determining correlation factors for all the possible combinations of selected two bands, determining, in decreasing order of the correlation factors, a predetermined number X of the combinations among all the combinations of which the correlation factors have been determined, determines the X bands as removal bands by selecting, without duplication, one band as a removal band for each of the determined X combinations, and removing the frequency components;

means for compressing the total length of a continuous spectrum distribution by shifting residual frequency components not removed toward the lower frequency side so as to reduce space in said removed frequency-band; and means for inversely transforming the spectrum signal having the compressed total length of said continuous spectrum distribution into a time sequence signal, wherein said removal band decision means further has means for outputting information indicative of the removal bands.

2. A frequency thinning apparatus, comprising:

spectrum distribution generating means for generating the signal representing the frequency spectrum of a signal to be directed to frequency thinning processing;

removal band decision means for determining correlation factors for all the possible combinations of selected two bands, determining, in decreasing order of the correlation factors, a predetermined number X of the combination among all the combinations of which the correlation factors have been determined, determines the X bands as removal bands by selecting, without duplication, one band as a removal band for each of the determined X combinations, and determining a band paired with the removal band as an interpolation band for each of the determined X combinations; and thinning compression means for substantially removing spectrum components in the removal bands by generating the spectrum signal having a continuous spectrum including the spectrum distribution of all sub-bands within said whole band except for the removal bands, wherein said removal band decision means further has means for outputting information indicative of the removal bands and the interpolation bands.

3. The frequency thinning apparatus according to claim 2, wherein said removal band decision means specifies said removal band and said interpolation band for each of the determined X combinations such that said interpolation band will not also serve as said removal band.

4. The frequency thinning apparatus according to claim 2, wherein said removal band decision means specifies said removal band and said interpolation band for each of the determined X combinations such that the sub-band adjacent to said removal band and occupying the substantially same bandwidth as said removal band will be said interpolation band which has been associated to said removal band.

5. The frequency thinning apparatus according to claim 2, wherein the signal to be directed to said thinning comprises a digital signal obtained by sampling and quantizing an analog audio signal.

6. A frequency thinning method for performing compression of signal information by removing specified frequency components in a given time sequence signal, said method comprising the steps of:

transforming the given time sequence signal into a frequency spectrum signal;

determining correlation factors for all the possible combinations of selected two bands;

determining, in decreasing order of the correlation factors, a predetermined number X of the combinations among all the combinations of which the correlation factors have been determined;

determining the X bands as removal bands by selecting, without duplication, one band as a removal band for each of the determined X combinations;

removing the frequency components in the removal bands;

compressing the total length of a continuous spectrum distribution by shifting residual frequency components not removed toward the lower frequency side so as to reduce space in said removal bands;

inversely transforming a spectrum signal having the reduced total length of said continuous spectrum distribution into a time sequence signal; and outputting information indicative of the removal bands.

7. A computer readable storage medium storing a program for making a computer function as, means for transforming a given time sequence signal into a frequency spectrum signal, removal band decision means for determining correlation factors for all the possible combinations of selected two bands, determining, in decreasing order of the correlation factors, a predetermined number X of the combinations among all the combinations of which the correlation factors have been determined, determining the X bands as removal bands by selecting, without duplication, one band as a removal band for each of the determined X combinations, and removing the frequency components in the removal bands, means for compressing the total length of a continuous spectrum distribution by shifting residual frequency components not removed toward the lower frequency side so as to reduce space in said removal bands, and means for inversely transforming a spectrum signal having the reduced total length of said continuous spectrum distribution into a time sequence signal, thereby compressing signal information by removing specified frequency components in the given time sequence signal.

wherein said removal band decision means further has means for outputting information indicative of the removal bands.

8. The frequency thinning apparatus according to claim 2, wherein said removal band decision means specifies said sub-band to be removed and said sub-band to be subjected to interpolation such that said sub-band to be subjected to interpolation will not also serve as said sub-band to be removed.

9. The frequency thinning apparatus according to claim 2, wherein said removal band decision means specifies said sub-band to be removed and said sub-band to be subjected to interpolation such that the sub-band adjacent to said sub-band to be removed and occupying the substantially same bandwidth as said sub-band to be removed will be said sub-band to be subjected to interpolation which has been associated to said sub-band to be removed.

10. The frequency thinning apparatus according to claim 3, wherein said removal band decision means specifies said sub-band to be removed and said sub-band to be subjected to interpolation such that the sub-band adjacent to said sub-band to be removed and occupying the substantially same bandwidth as said sub-band to be removed will be said sub-band to be subjected to interpolation which has been associated to said sub-band to be removed.

11. The frequency thinning apparatus according to claim 2, wherein the signal to be directed to said thinning comprises a digital signal obtained by sampling and quantizing an analog audio signal.

12. The frequency thinning apparatus according to claim 3, wherein the signal to be directed to said thinning comprises a digital signal obtained by sampling and quantizing an analog audio signal.

13. The frequency thinning apparatus according to claim 4, wherein the signal to be directed to said thinning comprises a digital signal obtained by sampling and quantizing an analog audio signal.

* * * * *